(12) United States Patent  
Kim

(10) Patent No.: US 7,968,965 B2  
(45) Date of Patent: Jun. 28, 2011

(54) SEMICONDUCTOR DEVICE AND METHOD FOR FABRICATING THE SAME

(75) Inventor: Sang-Chul Kim, Eumseong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 122 days.

(21) Appl. No.: 12/334,508

(22) Filed: Dec. 14, 2008

(65) Prior Publication Data

US 2009/0160012 A1    Jun. 25, 2009

(30) Foreign Application Priority Data

Dec. 21, 2007    (KR) .................. 10-2007-0135834

(51) Int. Cl.  
*H01L 23/522*    (2006.01)

(52) U.S. Cl. .......... 257/508; 257/686; 257/678; 257/67; 257/E23.142; 257/E25.013

(58) Field of Classification Search .............. 257/67, 257/508, 686, 678, E23.142, E25.013  
See application file for complete search history.

(56) References Cited

U.S. PATENT DOCUMENTS

| 4,612,629 | A  | * | 9/1986 | Harari ................ 365/185.08 |
| 6,429,484 | B1 | * | 8/2002 | Yu ........................... 257/347 |
| 7,247,528 | B2 | * | 7/2007 | Kwak et al. ............... 438/149 |

FOREIGN PATENT DOCUMENTS

KR    100776157    11/2007

* cited by examiner

*Primary Examiner* — Ngan Ngo  
*Assistant Examiner* — Benjamin Tzu-Hung Liu  
(74) *Attorney, Agent, or Firm* — Sherr & Vaughn, PLLC

(57) ABSTRACT

Embodiments relate to a semiconductor device and a method for fabricating the same. According to embodiments, a semiconductor device may include a first device, a silicon epitaxial layer formed on and/or over the first device, a second device formed on and/or over the silicon epitaxial layer, and a connection via formed through the silicon epitaxial layer, which may electrically interconnect the first device and the second device. According to embodiments, a method for fabricating a semiconductor device may include forming a first device, forming a silicon epitaxial layer on and/or over the first device, forming a connection via through the silicon epitaxial layer, and forming a second device on and/or over the silicon epitaxial layer such that the second device may be electrically connected to the connection via.

8 Claims, 4 Drawing Sheets

US 7,968,965 B2

SEMICONDUCTOR DEVICE AND METHOD FOR FABRICATING THE SAME

Figure 1:
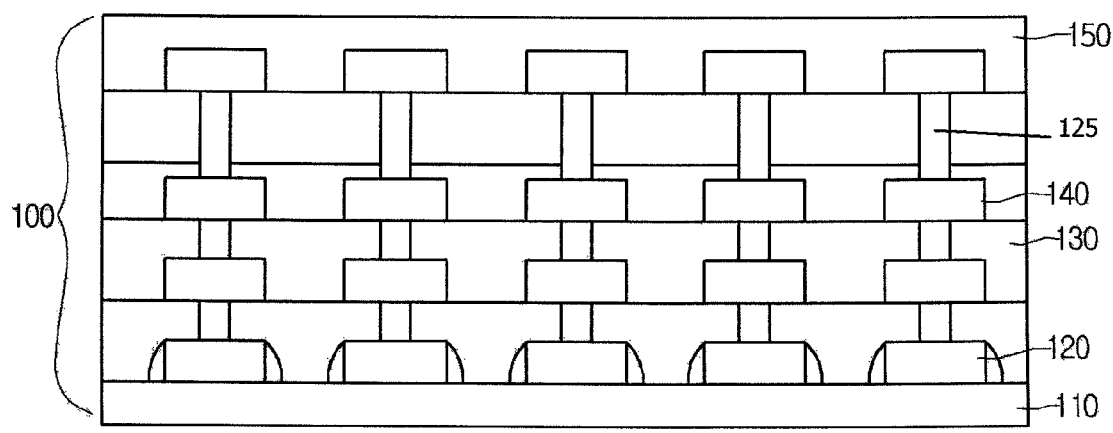

The present application claims priority under 35 U.S.C. 119 to Korean Patent Application No. 10-2007-0135834 (filed on Dec. 21, 2007), which is hereby incorporated by reference in its entirety.

BACKGROUND

A technology that may reduce a size of mounted parts may include a system on chip (SoC) technology for fabricating a plurality of individual devices into one chip, and a system in package (SIP) technology for integrating a plurality of individual devices into a single package. These systems may be needed to reduce a weight and size of semiconductor devices.

SIP technology may be a technology for mounting a plurality of silicon chips horizontally and vertically into a single package. SIP technology may be an extension of a related art multi-chip module (MCM) concept. According to a related art MCM, horizontal mounting may be principally carried out at the time of fabricating a package. For SIP, on the other hand, a technology for vertically stacking a plurality of chips may be principally applied.

A related art technology for vertically stacking a plurality of chips may include a method for forming predetermined semiconductor devices on and/or over a first semiconductor substrate and a second semiconductor substrate, and bonding the first semiconductor substrate and the second semiconductor substrate using an adhesive.

Via holes may extend through a first semiconductor substrate and a second semiconductor substrate, and via electrodes may be formed in respective via holes. A first semiconductor substrate and a second semiconductor substrate may thus be electrically connected to each other.

A related art SIP technology may have various problems. For example, it may be difficult to bond a first semiconductor substrate and a second semiconductor substrate. In addition, it may be difficult to form via holes and via electrodes to electrically interconnect a first semiconductor substrate and a second semiconductor substrate due to a limit of a technology for grinding a back of a second semiconductor substrate.

SUMMARY

Embodiments relate to a semiconductor device, and to a semiconductor device and a method for fabricating the same that may be capable of vertically stacking a plurality of devices into a single package.

According to embodiments, a semiconductor device may include at least one of the following. A first device. A silicon epitaxial layer formed on and/or over the first device. A second device formed on and/or over the silicon epitaxial layer. A connection via formed through the silicon epitaxial layer that may electrically interconnect the first device and the second device.

According to embodiments, a method for fabricating a semiconductor device may include at least one of the following. Forming a first device. Forming a silicon epitaxial layer on and/or over the first device. Forming a connection via through the silicon epitaxial layer. Forming a second device on and/or over the silicon epitaxial layer such that the second device may be electrically connected to the connection via.

DRAWINGS

Example FIGS. 1 through 6 are drawings illustrating a semiconductor device and a method for fabricating a semiconductor device, according to embodiments.

DESCRIPTION

According to embodiments, a semiconductor device and a method for fabricating the same may be characterized in that an epitaxial wafer may be formed on and/or over a first semiconductor substrate having a first device formed thereon. A second device may be mounted on and/or over the epitaxial wafer. This may be unlike a related art method for bonding a first semiconductor substrate having a first device formed thereon to a second semiconductor substrate having a second device formed thereon to form a single package. According to embodiments, a problem related to a bonding strength and/or a problem related to formation of a via electrode may be minimized.

Example FIGS. 1 through 6 are drawings illustrating a semiconductor device and a method for fabricating the same, according to embodiments. Referring to example FIG. 1, first device 100 may be formed. A plurality of first transistors 120 may be formed on and/or over semiconductor substrate 110. According to embodiments, multi-layered first interlayer insulation film 130, which may include a plurality of first metal wires 140 and first contacts 125 to interconnect the first metal wires 140, may be formed on and/or over semiconductor substrate 110.

According to embodiments, first device 100 may be at least one of a CPU, a SRAM, a DRAM, a flash memory, a logic device, a power IC, a control IC, an RF IC, and a sensor chip. According to embodiments, first device 100 may be a semiconductor device having any arbitrary function.

According to embodiments, first device 100 may further include protective film 150, which may be formed on and/or over multi-layered first interlayer insulation film 130. Protective film 150 may be formed of the same material as first interlayer insulation film 130.

Figure 2:
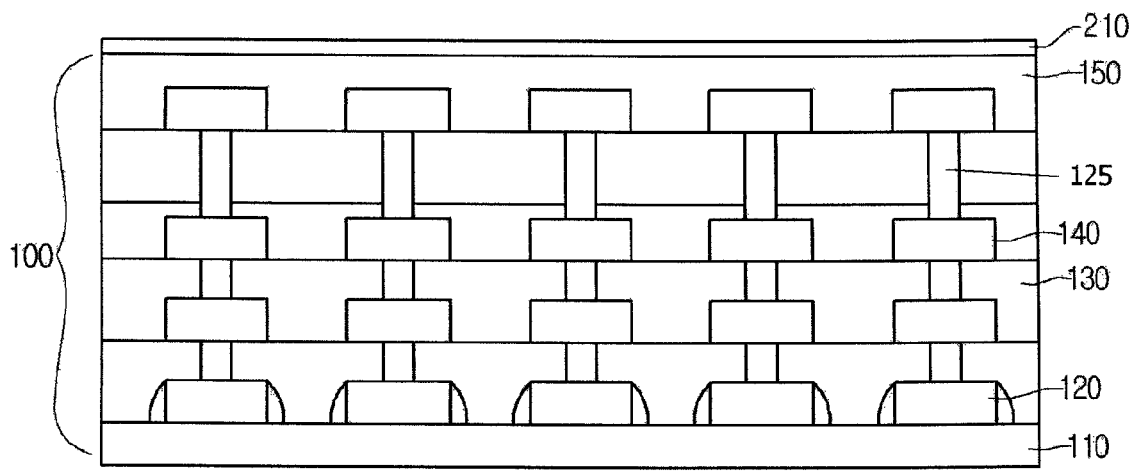

Referring to example FIG. 2, etch stop layer 210 may be formed at a top of first device 100. According to embodiments, etch stop layer 210 may be formed by depositing a SiN-based or a SiC-based material, for example using CVD. Etch stop layer 210 may be used when forming connection vias to electrically connect a second device, which may be formed on and/or over first device 100, and first device 100. Etch stop layer 210 may prevent electric current from flowing from second device 200 to first device 100.

Figure 3:
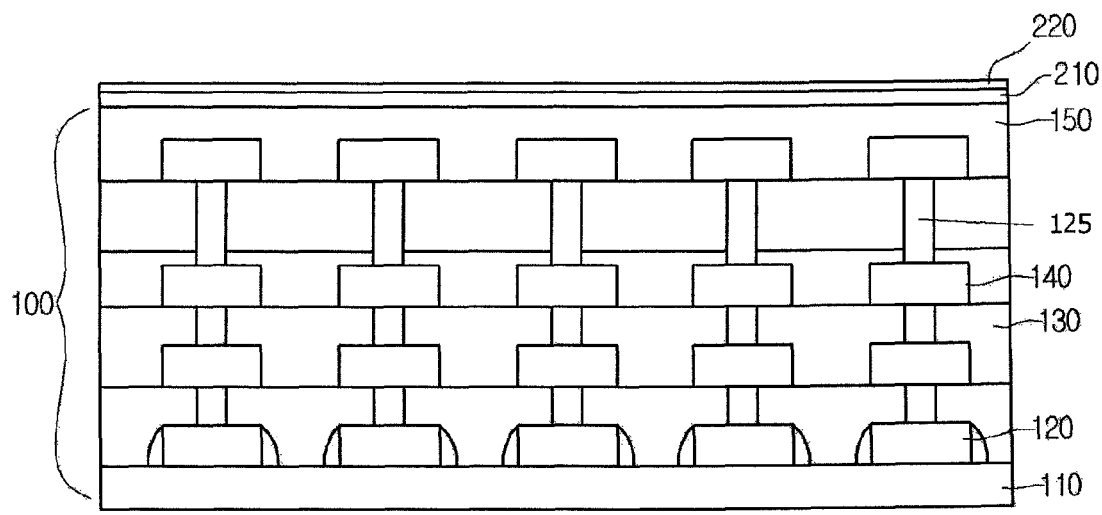

Referring to example FIG. 3, silicon (Si) monolayer 220 may be formed on and/or over etch stop layer 210. Si monolayer 220 may serve as a seed layer for a silicon epitaxial layer, which may be formed later. Si monolayer 220 may be formed at a top of etch stop layer 210, for example by injecting a silane (SiH4) gas into a CVD chamber and carrying out a soaking process using the silane gas.

Figure 4:
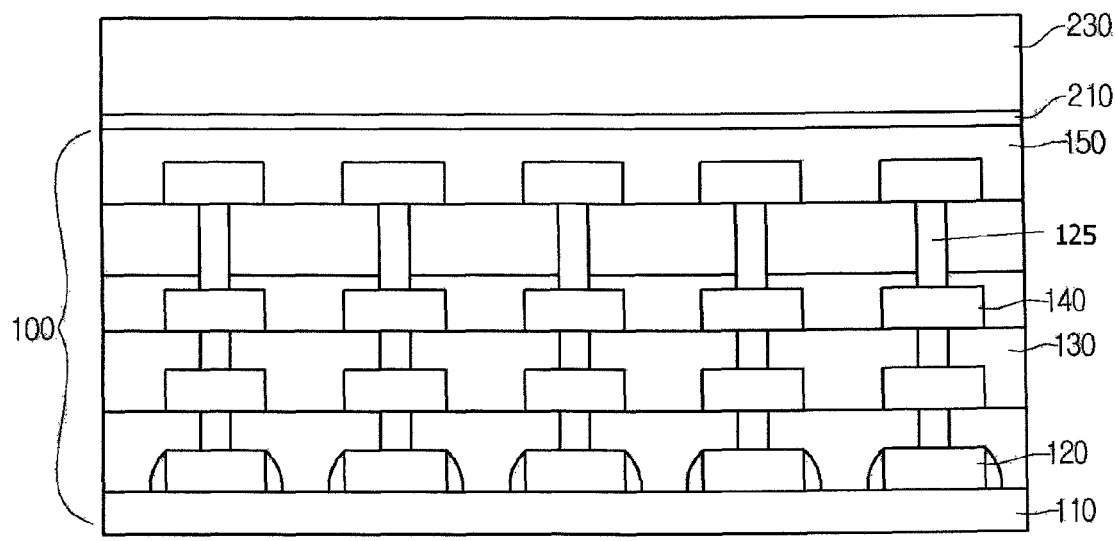

Referring to example FIG. 4, silicon epitaxial layer 230 may be grown on and/or over Si monolayer 220, for example by an epitaxy process. According to embodiments, silicon epitaxial layer 230 may have a thickness of approximately 2,000 to 20,000 Å. According to embodiments, a thickness of silicon epitaxial layer 230 may be selected based on a thickness of shallow trench isolation (STI), which may be formed on and/or over silicon epitaxial layer 230.

Figure 5:
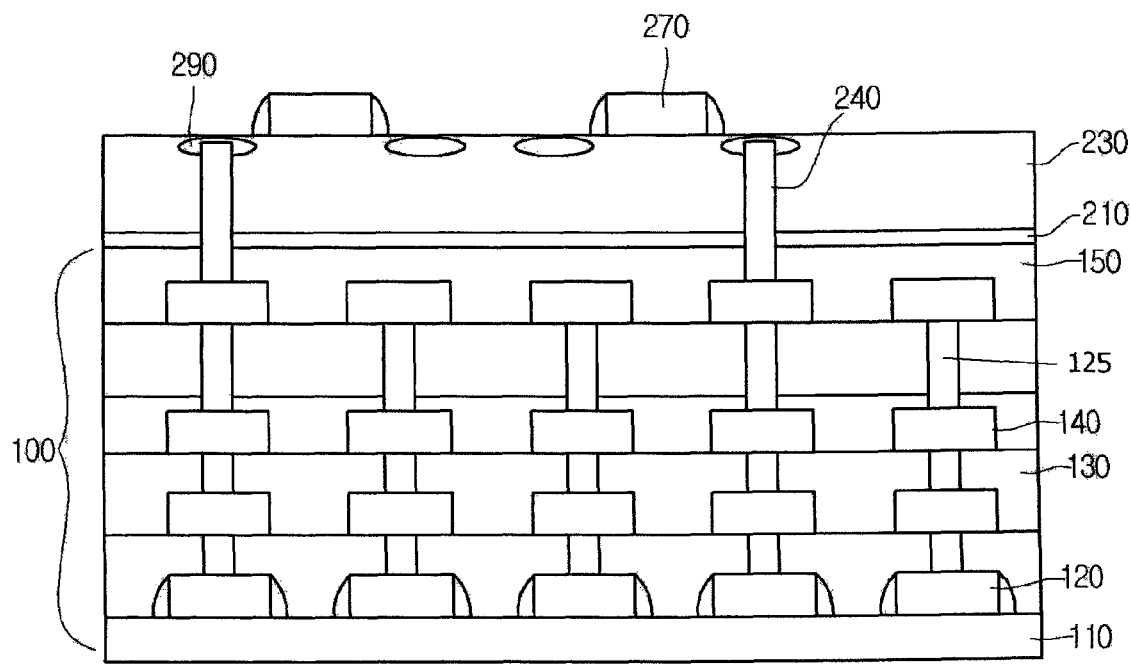

Referring to example FIG. 5, connection vias 240 may be formed through silicon epitaxial layer 230. Connection vias 240 may be electrically connected to first device 100.

According to embodiments, a photoresist pattern may be formed on and/or over silicon epitaxial layer 230, for example by a photolithography process. A photoresist pattern may expose silicon epitaxial layer 230 corresponding to at least one of first metal wires 140. Subsequently, silicon epitaxial layer 230 and etch stop layer 210 may be sequentially etched, using the photoresist pattern as an etch mask. This may form via holes. The photoresist pattern may then be removed. According to embodiments, the via holes may be filled with metal, such as tungsten (W), copper (Cu), aluminum (Al), or silver (Ag). This may be done by chemical vapor deposition (CVD), physical vapor deposition (PVD), or electro copper plating (ECP), and may form connection vias 240.

According to embodiments, a Ti-based or Ta-based material may be used as a diffusion preventing film of the connection vias 240. For example, at least one of TaN, TiN, Ti, and TiSiN may be used as a diffusion preventing film.

According to embodiments, second device 200 (example FIG. 6) may be formed on and/or over silicon epitaxial layer 230. Second transistors 270, which may each include a gate pattern, a spacer, and source/drain region 290, may be formed on and/or over silicon epitaxial layer 230. Each source/drain region 290 may be formed, such that each source/drain region 290 may overlap with corresponding connection vias 240. This may be done by implanting impurity ions into silicon epitaxial layer 230.

According to embodiments, second transistors 270 may be electrically connected to respective connection vias 240. According to embodiments, a source or drain region surface of each second transistor 270 may be silicided. This may reduce contact resistance with corresponding connection vias 240.

Figure 6:
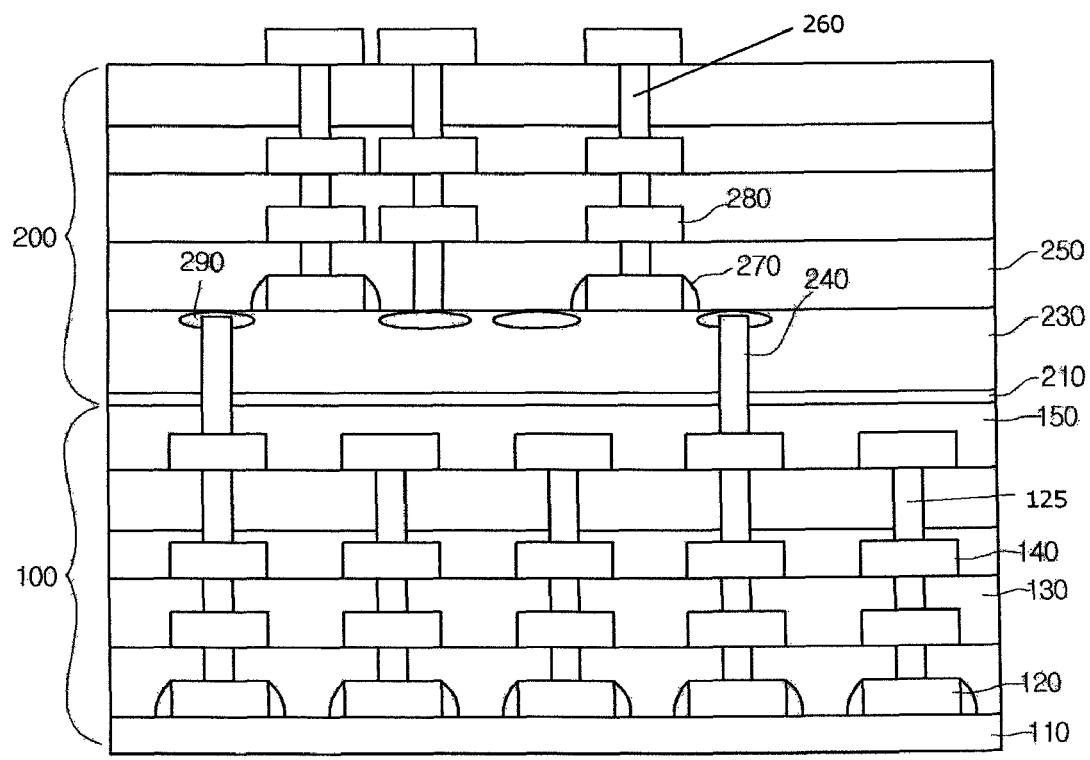

Referring to example FIG. 6, multi-layered second interlayer insulation film 250 may be formed on and/or over silicon epitaxial layer 230 having second transistors 270 formed thereon. According to embodiments, multi-layered second interlayer insulation film 250 may include a plurality of second metal wires 280 and second contacts 260, which may interconnect second metal wires 280. According to embodiments, second device 200 may include second transistors 270 formed on and/or over silicon epitaxial layer 230, the plurality of second metal wires 280, the plurality of second contacts 260, and multi-layered second interlayer insulation film 250.

According to embodiments, second device 200 may be at least one of a CPU, a SRAM, a DRAM, a flash memory, a logic device, a power IC, a control IC, an RF IC, and a sensor chip. According to embodiments, second device 200 may be a semiconductor device having any arbitrary function.

According to embodiments, a semiconductor device and a method for fabricating the same may be characterized in that silicon epitaxial layer 230 may be formed on and/or over first device 100. Second device 200 may be formed on and/or over silicon epitaxial layer 230. According to embodiments, first device 100 or second device 200 may be a semiconductor device that may include at least transistors, metal wires, and STI.

According to embodiments, in a semiconductor device and a method for fabricating the same, two devices may not be attached to each other using an adhesive. According to embodiments, silicon epitaxial layer 230, which may include connection vias 240, may be formed between first device 100 and second device 200. According to embodiments, it may be possible to electrically connect and package first device 100 and second device 200 through connection vias 240 without an additional bonding process.

According to embodiments, in a semiconductor device and a method for fabricating the same, a thickness of silicon epitaxial layer 230 may be relatively small. Therefore, it may be possible to reduce a length of connection vias and a thickness of second device 200, which may be advantageous for integration.

According to embodiments, a semiconductor device and a method for fabricating the same may provide for vertically stacking a plurality of devices into a single package.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
    a first device including a plurality of first transistors formed on a substrate, a first multilayered interlayer insulation film formed over the substrate, a protective layer formed on the first multilayered interlayer insulation film, a plurality of first metal wires formed in the first multilayered interlayer insulation film, and a plurality of first contacts formed in the first multilayered interlayer insulation film to interconnect the plurality of first metal wires;
    an etch stop layer formed on the protective layer;
    a silicon epitaxial layer formed over the etch stop layer;
    a second device formed over the silicon epitaxial layer, wherein the second device includes a plurality of second transistors on the silicon epitaxial layer, a second multilayered interlayer insulation film over the silicon epitaxial layer, a plurality of second metal wires formed in the second multilayered interlayer insulation film, and a plurality of second contacts formed in the second multilayered interlayer insulation film to interconnect the plurality of second metal wires; and
    a connection via formed through the silicon epitaxial layer, the etch stop layer, and the protective layer to electrically interconnect the first device and the second device.

2. The device of claim 1, wherein at least one of the plurality of second transistors in the second device is connected to at least one of the plurality of first metal wires of the first device through the connection via.

3. The device of claim 1, wherein a source/drain region of at least one of the plurality of second transistors in the second device overlaps the connection via.

4. The device of claim 3, wherein the connection via interconnects one of the plurality of first metal wires in the first device and the source/drain region of at least one of the plurality of second transistors in the second device through the etch stop layer, the silicon epitaxial layer, and the protective layer in the first device.

5. The device of claim 1, wherein each of the first and second devices comprises at least one of a CPU, a SRAM, a DRAM, a flash memory, a logic device, a power IC, a control IC, an RF IC, and a sensor chip.

6. The device of claim 1, wherein the etch stop layer comprises at least one of a SiN-based and a SiC-based material.

7. The device of claim 1, wherein the silicon epitaxial layer has a thickness of approximately 2,000 to 20,000 Å.

8. The device of claim 1, wherein the silicon epitaxial layer is in direct contact with the etch stop layer and the etch stop layer is in direct contact with the protective layer.

* * * * *